(12) United States Patent
Kim

(10) Patent No.: US 7,598,538 B2
(45) Date of Patent: Oct. 6, 2009

(54) ESD PROTECTING CIRCUIT AND MANUFACTURING METHOD THEREOF

(75) Inventor: San Hong Kim, Bucheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 8 days.

(21) Appl. No.: 11/502,834

(22) Filed: Aug. 11, 2006

(65) Prior Publication Data

US 2007/0034897 A1     Feb. 15, 2007

(30) Foreign Application Priority Data

Aug. 11, 2005   (KR) ..................... 10-2005-0073766

(51) Int. Cl.
*H01L 23/60*   (2006.01)
(52) U.S. Cl. ................. 257/173; 257/328; 257/355; 257/360; 257/546; 361/90; 361/91.1
(58) Field of Classification Search ............... None
See application file for complete search history.

(56) References Cited

U.S. PATENT DOCUMENTS

| | | | |
|---|---|---|---|
| 5,166,089 A * | 11/1992 | Chen et al. ................. 438/328 |
| 5,324,982 A * | 6/1994 | Nakazato et al. ............. 257/546 |
| 5,856,214 A * | 1/1999 | Yu ............................. 438/133 |
| 6,433,395 B2 * | 8/2002 | Hsu ........................... 257/367 |
| 6,498,357 B2 * | 12/2002 | Ker et al. .................... 257/173 |
| 6,855,586 B2 * | 2/2005 | Walker et al. ............... 438/174 |
| 2003/0197226 A1 * | 10/2003 | Chen et al. .................. 257/355 |

* cited by examiner

*Primary Examiner*—Minh-Loan T Tran
*Assistant Examiner*—Fei Fei Yeung Lopez
(74) *Attorney, Agent, or Firm*—The Law Offices of Andrew D. Fortney; Andrew D. Fortney

(57) ABSTRACT

An ESP protecting circuit and a manufacturing method thereof are provided. The ESP protecting circuit includes a device isolation layer, first and second high-concentration impurity regions, a third high-concentration impurity region of a complementary type, first and second conductive wells, and a fourth conductive impurity region. The ESD protecting circuit is configured as a field transistor without a gate electrode, and the high breakdown voltage characteristics of the field transistor are lowered by implanting impurity ions, providing an ESD protecting circuit with a low breakdown voltage and low leakage current. Because the leakage current is reduced, the ESD protecting circuit can be used for an analog I/O device that is sensitive to current fluxes. Also, an N-type well may protect a junction of the field transistor.

20 Claims, 6 Drawing Sheets

ESD PROTECTING CIRCUIT AND MANUFACTURING METHOD THEREOF

BACKGROUND OF THE INVENTION

1. Field of the Invention

The present invention relates to an electro-static discharge (ESD) circuit, and more particularly, to an ESD protecting circuit and a manufacturing method thereof capable of protecting a junction of a field transistor, and suitable for an analog input/output device by giving the device a low breakdown voltage.

2. Description of the Related Art

In general, ESD occurs when a user who is electro-statically charged (e.g., by friction and/or induction) touches electronic components. Integrated circuits (IC), especially those formed from metal oxide semiconductor (MOS) transistors are particularly vulnerable to ESDs. An ESD can be transmitted to an input/output pad, an electrical pin, or other IC pad, and such a transmitted ESD can inflict severe damage to a semiconductor's connectors, dielectrics, interconnectors, and other IC components.

Recently, as semiconductor device sizes continue to shrink and the devices become more highly integrated, ESD protecting circuits with a gate grounded NMOS (GGNMOS) configuration using lateral parasitic bipolar characteristics of MOS transistors are being used. An ESD protecting circuit according to the related art that uses the GGNMOS will now be described with reference to FIG. 1, which is a sectional view of such an ESD protecting circuit.

That is, in a P-type semiconductor substrate 1, the active region and the field region are defined by a device isolation layer 2 in the field region. The device isolation layer 2 has a shallow trench formed in the P-type semiconductor substrate 1 in the field region, and the shallow trench is filled with an insulating material.

A gate insulating layer 3 and a gate electrode 4 are stacked on the active region, and a sidewall insulating layer 5 is formed on sides of the gate electrode 4. A low-concentration, N-type impurity region, i.e., a lightly doped drain (LDD) 12, is formed at sides of the gate electrode 4 on the P-type semiconductor substrate 1. Source and drain impurity regions 6a and 6b are formed in the P-type semiconductor substrate 1 at sides of the sidewall insulating layer 5 by implanting high-concentration, N-type impurity ions. One end of the drain impurity region 6b is isolated by the device isolation layer 2 from a P-type impurity region 7, formed in the substrate 1 by conventional ion implantation of P-type impurity ions.

A silicide layer 10 is formed respectively on the surfaces of the N-type source and drain impurity regions 6a and 6b and the P-type impurity region 7. An interlayer insulating layer 8 is formed on the entire surface of the semiconductor substrate 1, and contact holes are formed in the interlayer insulating layer 8 in order to expose portions of the silicide layer 10 on the N-type source and drain impurity regions 6a and 6b and the P-type impurity region 7.

A plurality of plugs 9, for electrically connecting the N-type source and drain impurity regions 6a and 6b and the P-type impurity region 7 to overlying metal lines, are formed in the contact holes, and a plurality of metal lines 11 are formed in contact with the plugs 9.

The above-configured ESD protecting circuit of the GGNMOS structure according to the related art uses the lateral parasitic bipolar characteristics of a MOS transistor to bypass an ESD. An ESD protecting circuit in a GGNMOS structure according to the related art is highly effective in a digital I/O device that is not sensitive to a leakage current. However, it has a comparatively high leakage current in an analog I/O device, so that there are many restrictions imposed on its design in an analog circuit.

That is, the thickness of the gate insulating layer is reduced due to a miniaturization of a device of a GGNMOS structure, and the concentration of the LDD increases when impurity concentration of P-type impurities on the P-type semiconductor substrate increases. Accordingly, the amount of leakage current gradually increases. Therefore, in an analog I/O device that is sensitive to even small current fluxes, there is a limit to level of ESD protection that can be provided.

Additionally, because a field transistor does not have a gate electrode, it cannot realize a gate induced barrier lowering (GIBL), and has an ESD trigger voltage instead. Because the field transistor generally has a high breakdown voltage, when an ESD is emitted, the relatively sensitive inner circuits may not be adequately protected, and it may be difficult to use a field transistor as an ESD protecting circuit.

SUMMARY OF THE INVENTION

Accordingly, the present invention is directed to an ESD protecting circuit and a manufacturing method thereof that substantially obviate one or more problems due to limitations and disadvantages of the related art.

An object of the present invention is to provide an ESD protecting circuit and a manufacturing method thereof that use a field transistor structure without a gate electrode to reduce leakage voltage.

Further objects of the present invention are to form an N-type well-in a region with a drain (or emitter) contact formed therein of the field transistor to protect a junction, add an ion implant to reduce the relatively high breakdown voltage of the field transistor (e.g., to a relatively low breakdown voltage), and provide an adequate ESD protecting circuit appropriate for an analog I/O device.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure(s) particularly pointed out in the written description and claims hereof as well as the appended drawings.

To achieve these objects and other advantages and in accordance with the purpose of the invention, as embodied and broadly described herein, there is provided an ESD (electro-static discharge) protecting circuit including: a device isolation layer in a field region of a semiconductor substrate having a first conductivity type; first and second high-concentration impurity regions isolated from each other by the device isolation layer, in the semiconductor substrate and having a second conductivity type; a third high-concentration impurity region isolated from the second high-concentration impurity region by the device isolation layer, in the semiconductor substrate on one side of the second high-concentration impurity region and having the first conductivity type; a first well in the semiconductor substrate below the second and third high-concentration second conductive impurity regions, and below a first portion of the first high-concentration impurity region; a second well in the semiconductor substrate below a remaining portion of the first high-concentration impurity region on one side of the first well; and a fourth impurity region below the first high-concentration impurity region at a boundary between the first and second wells, having the first conductivity type. The fourth impurity region is generally configured to reduce a breakdown voltage of the ESD protecting circuit (e.g., a field transistor defined at least in part by the first, second, third and fourth impurity regions).

In another aspect of the present invention, there is provided a method of manufacturing an ESD protecting circuit, the method including: forming a device isolation layer in a field region of a semiconductor substrate having a first conductivity type; forming a first well and a second well in the semiconductor substrate; forming a first high-concentration impurity region in the first and second wells and a second high-concentration impurity region in the first conductive well, the first and second high-concentration impurity regions having a second conductivity type; forming a third high-concentration impurity region in a portion of the first well on one side of the second high-concentration impurity region, the third high-concentration impurity region having the first conductivity type; and forming a fourth impurity region below the first high-concentration impurity region at a boundary between the first and second wells, the fourth impurity region having the first conductivity type and being configured to reduce a breakdown voltage of the ESD protecting circuit.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to an ESD protecting circuit and a manufacturing method thereof, according to preferred embodiments of the present invention, examples of which are illustrated in the accompanying drawings. Wherever possible, the same reference numbers will be used throughout the drawings to refer to the same or like parts.

Figure 1:
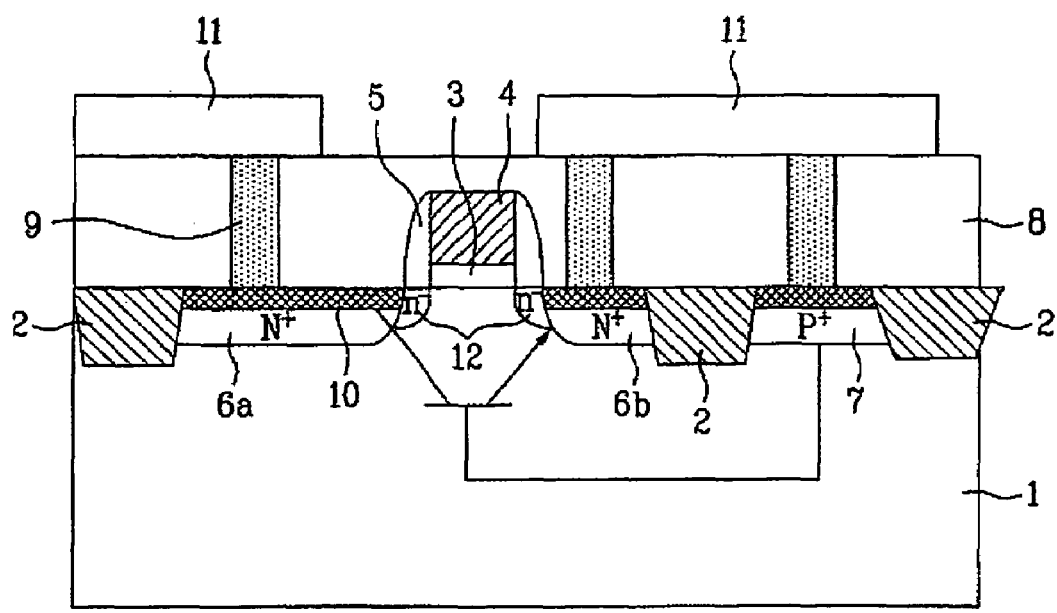
FIG. 1 is a sectional view of an ESP protecting circuit according to the related art.
Figure 2:
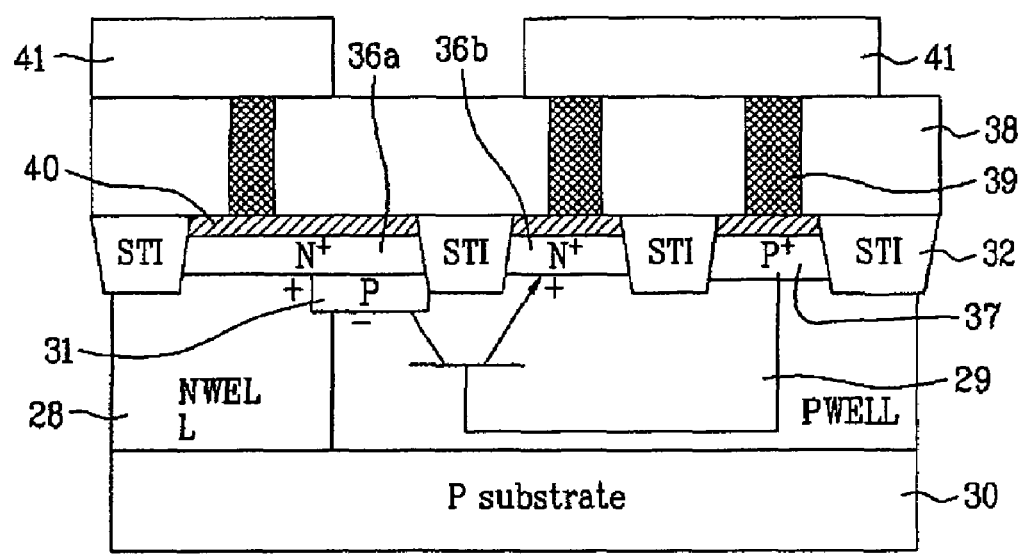
FIG. 2 is a sectional view of an ESD protecting circuit according to the present invention.

FIG. 2 is a sectional view of an ESD protecting circuit according to the present invention.

An ESD protecting circuit according to the present invention, as described above, includes an N-type well in a field transistor structure that does not require a gate electrode and adds an ion implant process step to reduce leakage voltage, protect a junction, and give the field transistor a low breakdown voltage, so that it is appropriate for an analog I/O device.

Thus, referring to FIG. 2, an active region and a field region are defined on a P-type semiconductor substrate 30, and a device isolation layer 32 is formed in the field region(s). The device isolation layer 32 includes a shallow trench formed in the P-type semiconductor substrate 30 in the field region, and an insulating material is filled in the trench to form a shallow trench isolation (STI) layer.

First and second high-concentration, N-type impurity regions 36a and 36b that correspond to a collector and an emitter of a transistor are formed in the active region of the P-type semiconductor substrate 30, and a high-concentration P-type impurity region 37 that corresponds to a base of the transistor is formed in the surface of the P-type semiconductor substrate 30 that is located on one side of the second high-concentration N-type impurity region 36b (e.g., on an opposite side of STI layer 32). Here, the first and the second high-concentration N-type impurity regions 36a and 36b and the high-concentration P-type impurity region 37 are mutually separated (e.g., physically separated from each other) by the device isolation layer 32.

A P-type well 29 is formed in the P-type semiconductor substrate 30 on and/or under the high-concentration, P-type impurity region 37, the second high-concentration, N-type impurity region 36b, and a portion of the first high-concentration N-type impurity region 36a. An N-type well 28 is formed in the P-type semiconductor substrate 30 on and/or under the remaining portion of the first high-concentration N-type impurity region 36a not having the P-type well 29 formed thereon or therein.

A P-type impurity region 31, for controlling a breakdown voltage of the ESD protecting circuit (e.g., of a field transistor in or constituting the ESD protecting circuit) is formed at the boundary of the N-type well 28 at the bottom of (e.g., below) the first high-concentration, N-type impurity region 36a, at least partially in the P-type well 29. To control the breakdown voltage, the P-type impurity region 31 may have an impurity concentration of $1\times10^{17}$ to $1\times10^{19}$ atoms/cm$^3$.

A silicide layer 40 is formed respectively on the surfaces of the high-concentration, N-type impurity regions 36a and 36b and the high-concentration, P-type impurity region 37.

An interlayer insulating layer 38 is formed on the entire surface of the above semiconductor substrate 30, and contact holes are formed in the interlayer insulating layer 38 to expose the silicide layer 40 over the high-concentration N-type impurity regions 36a and 36b and the high-concentration P-type impurity region 37. A plurality of plugs 39 are formed in the contact holes to electrically connect the silicide layer 40 on the high-concentration, N-type impurity regions 36a and 36b and the high-concentration, P-type impurity regions 37 to overlying metal lines. A plurality of metal lines (e.g., 41) are formed to connect with each of the plugs 39.

A description of a manufacturing method of the above-structured ESD protecting circuit according to the present invention will now be given.

FIGS. 3A through 3J are sectional views showing the manufacturing stages of an ESD protecting circuit, according to the present invention.

Figure 3A:
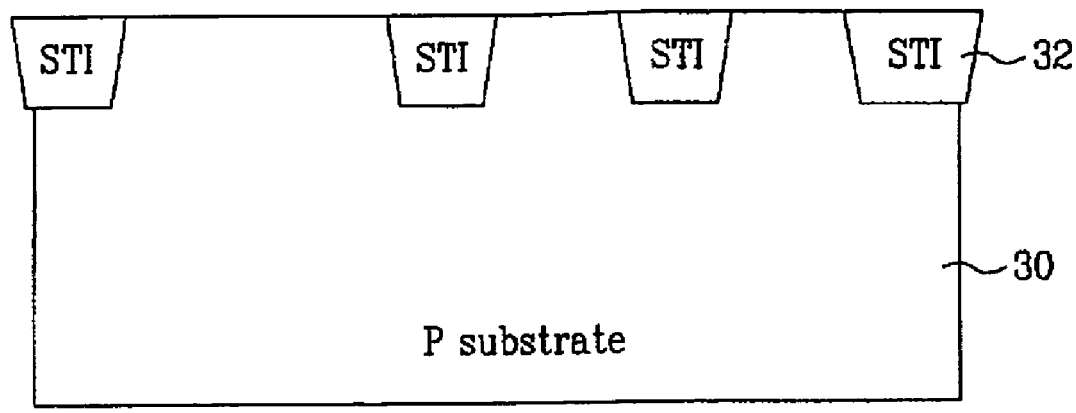
FIGS. 3A through 3J are sectional views showing the manufacturing stages of an ESD protecting circuit, according to the present invention.

Referring to FIG. 3A, an active region and a field region are defined on a P-type semiconductor substrate 30, and a shallow trench is etched a predetermined depth into the field region. Then, after an insulating layer (e.g., comprising an oxide layer such as silicon dioxide, an insulating nitride layer such as silicon nitride, etc., or a combination thereof) is filled in the trench (e.g., by thermal growth, chemical vapor deposition, etc.), a device isolation layer 32 is formed by a CMP process to leave an STI layer in the trench.

Figure 3B:
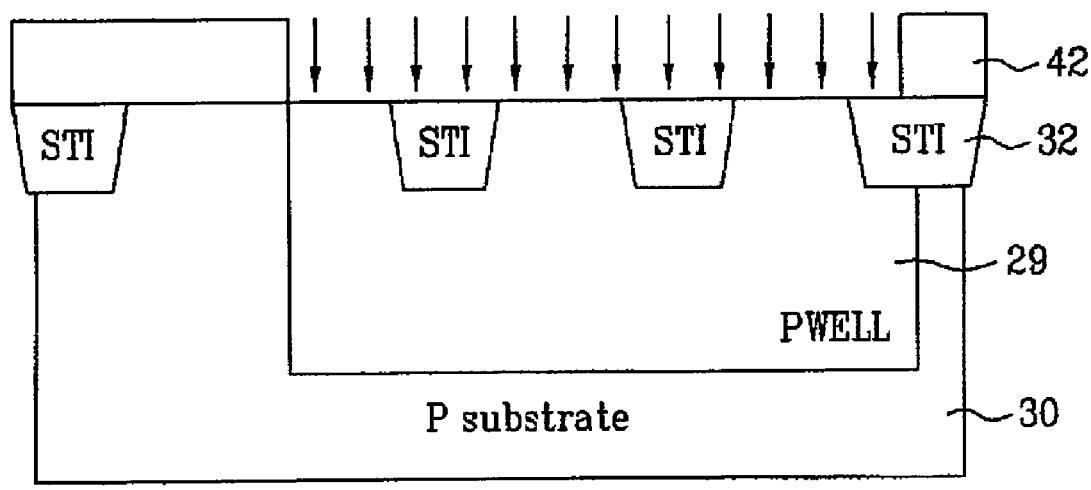

Referring to FIG. 3B, a first photosensitive film 42 is deposited on the entire surface, and it is patterned and exposed through exposing and developing processes to define the P-type well region. The patterned first photosensitive film 42 is used as a mask, and a P-type well 29 is formed by implanting P-type impurity ions into the P-type semiconductor substrate 30, generally at a low dose and a high energy.

Figure 3C:
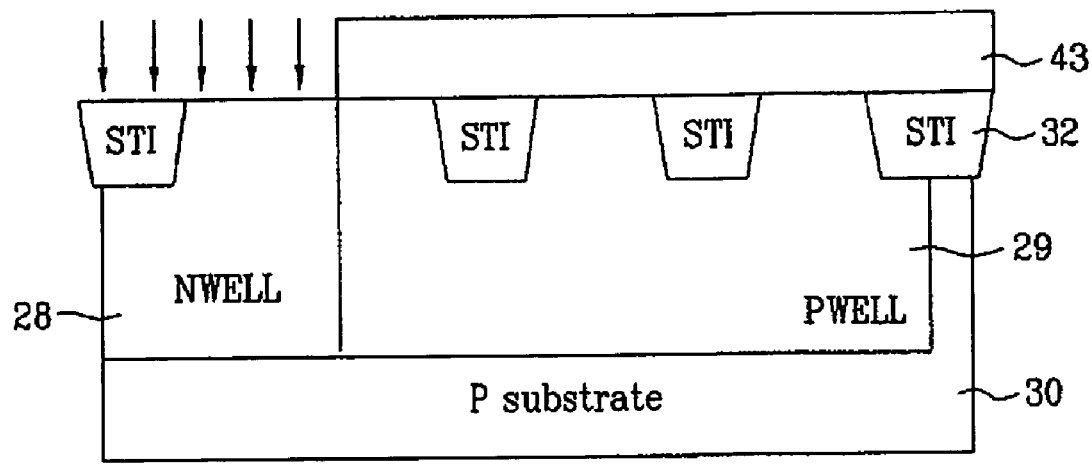

Referring to FIG. 3C, the first photosensitive film 42 is removed, after which a second photosensitive film 43 is deposited on the entire surface, and exposing and developing processes are conducted to define an N-type well region. The patterned second photosensitive film 43 is used as a mask, and an N-type well 28 is formed by implanting N-type impurity ions on the P-type semiconductor substrate 30, generally at a low dose and a high energy.

Figure 3D:
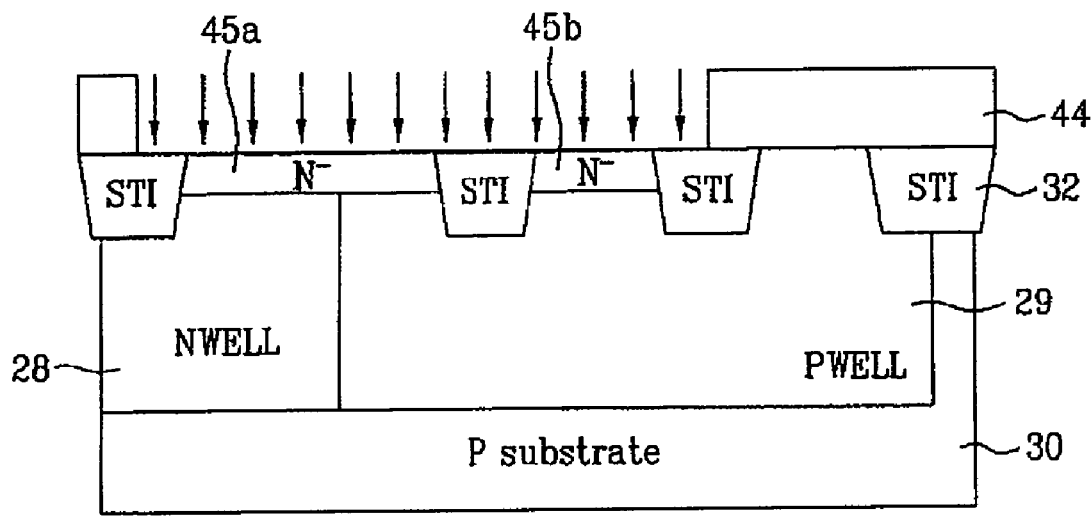

Referring to FIG. 3D, after the second photosensitive film 43 is removed, a third photosensitive film 44 is deposited on the entire surface, and exposing and developing processes are conducted to define collector and emitter regions of the field transistor. The patterned third photosensitive film 44 is used as a mask, and N-type transistor terminal structures (e.g., lightly doped drains [LDDs] or collector/emitter extension regions) 45a and 45b are formed by implanting N-type impurity ions at low concentration into the P-type semiconductor substrate 30.

Figure 3E:
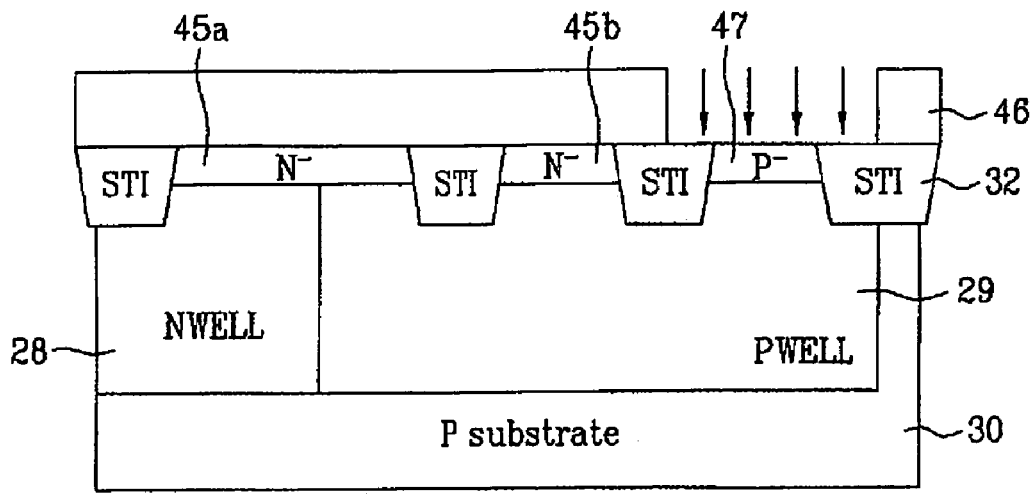

Referring to FIG. 3E, after the third photosensitive film 44 is removed, a fourth photosensitive film 46 is deposited on the entire surface, and exposing and developing processes are conducted to define a base region of the field transistor. The patterned fourth photosensitive film 46 is used as a mask, and a P-type transistor terminal structure (e.g., a lightly doped drain [LDD] or extension region) 47 is formed by implanting P-type impurity ions at low concentration in the P-type semiconductor substrate 30.

Figure 3F:
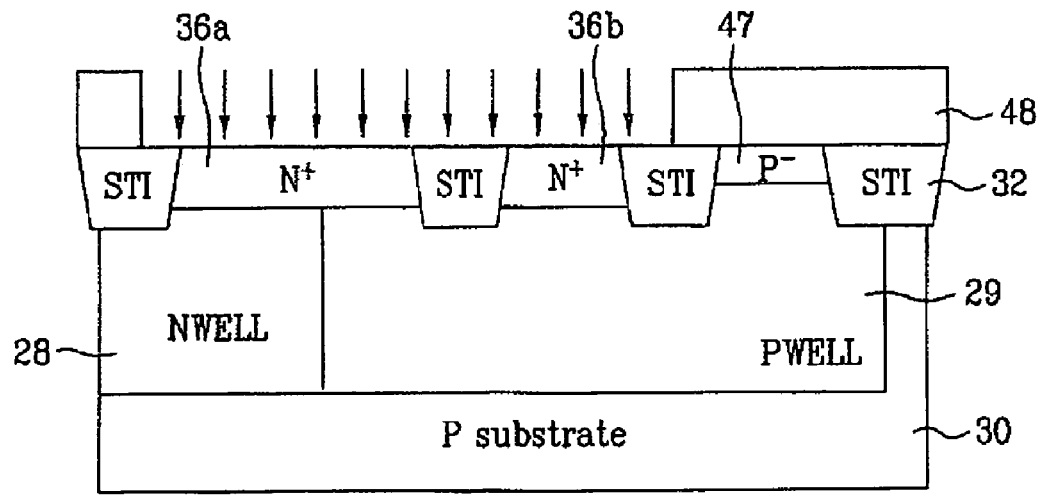

Referring to FIG. 3F, after the fourth photosensitive film 46 is removed, a fifth photosensitive film 48 is deposited on the entire surface, and exposing and developing processes are conducted to further define collector and emitter regions of the field transistor. The patterned fifth photosensitive film 48 is used as a mask, and a first and second high-concentration transistor terminal structures (e.g., N-type lightly doped drains [LDDs], or collector and emitter regions) 36a and 36b are formed by implanting N-type impurity ions at a high concentration into the P-type semiconductor substrate 30, and generally at a higher energy than structures 45a and 45b.

Here, in the implanting of the high-concentration, N-type impurity ions, N-type impurity ions such as P and As are implanted at a concentration of about $10^{15}$ atoms/cm$^2$, and the ion implantation energy used is at or below 50 KeV. In a process using the implant steps of both FIGS. 3D and 3F, one may implant a first dopant species (e.g., P) in the low-concentration, relatively low-energy implant step of FIG. 3D, and a second dopant species (e.g., As) in the high-concentration, relatively high-energy implant step of FIG. 3F. Alternatively, if a single dopant species is used, it may be possible to omit the low-concentration implant step described with respect to FIG. 3D.

Figure 3G:
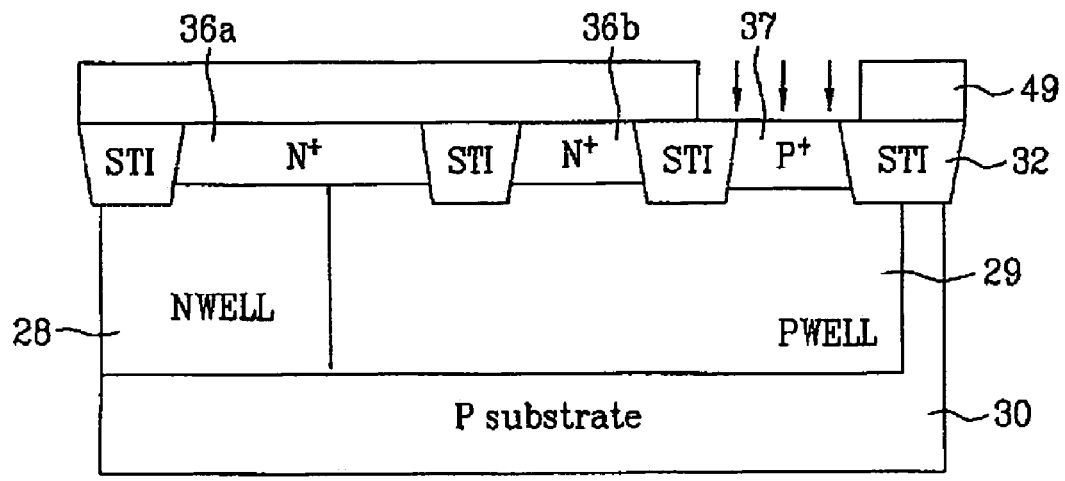

Referring to FIG. 3G, after the fifth photosensitive film 48 is removed, a sixth photosensitive film 49 is deposited on the entire surface, and exposing and developing processes are conducted to define the base region of the field transistor. The patterning sixth photosensitive film 49 is used as a mask, and a P-type impurity region 37 is formed by implanting P-type impurity ions at a high concentration on the P-type semiconductor substrate 30, and generally at a higher energy than structure 47 in FIG. 3E.

Here, in implanting the high-concentration, P-type impurity ions, P-type impurity ions such as boron (B) are implanted at a concentration of about $10^{15}$ atoms/cm$^2$, and the ion implantation energy used is at or below 20 KeV. In a process using the implant steps of both FIGS. 3E and 3G, one may implant the dopant in a low dose and a relatively low energy in the step of FIG. 3E, and at a high dose and a relatively high energy in the step of FIG. 3G. Alternatively, it may be possible to omit the low-concentration implant step described with respect to FIG. 3E.

Figure 3H:
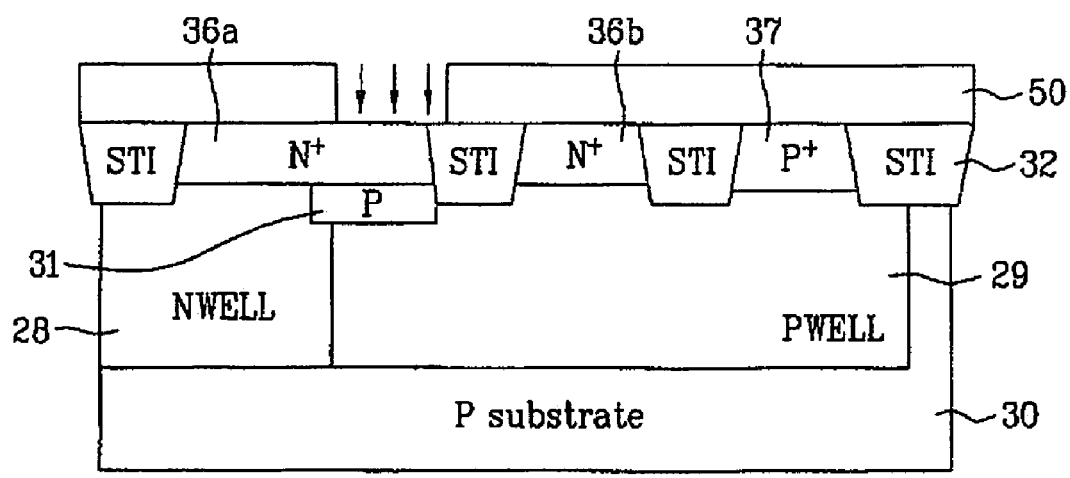

Referring to FIG. 3H, after the sixth photosensitive film 49 is removed, a seventh photosensitive film 50 is deposited on the entire surface, and exposing and developing processes are conducted to enable implantation at the boundary of the N-type well 28 and the P-type well 29, below the first high-concentration, N-type impurity region 36a. The patterned seventh photosensitive film 50 is used as a mask, and a P-type impurity region 31 is formed by implanting P-type impurity ions at a high concentration on the P-type semiconductor substrate 30, and generally at a relatively high energy (e.g., relative to the implant of base region 37). The impurity region 31 is generally configured to control the breakdown voltage of the field transistor (e.g., by its position at the boundary or interface between the N-type well 28 and the P-type well 29, by its implant energy and/or dopant distribution, by the dose, etc.).

Here, in implanting the P-type impurity ions, P-type impurity ions such as boron (B) are implanted at a concentration of from about $3 \times 10^{13}$ atoms/cm$^2$ to about $7 \times 10^{13}$ atoms/cm$^2$, and the ion implantation energy used is from 60 to 100 KeV. Accordingly, the P-type impurity region 31 for controlling the breakdown voltage has an impurity concentration of $1 \times 10^{17}$ atoms/cm$^3$ to $1 \times 10^{19}$ atoms/cm$^3$.

Figure 3I:
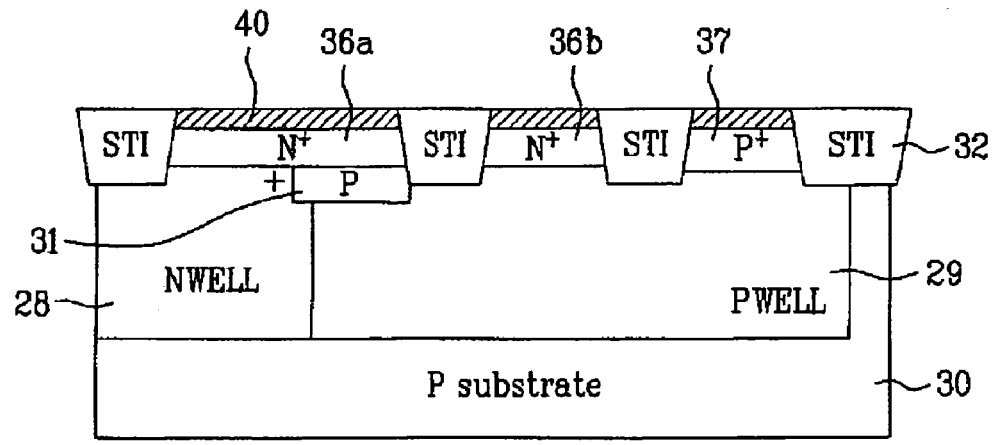

Referring to FIG. 3I, after the seventh photosensitive film 50 is removed, a silicide process is performed to form a silicide layer 40 on the surfaces of a first and second high-concentration, N-type impurity region 36a and 36b and a high-concentration, P-type impurity region 37. Here, the silicide process deposits a metal with a high melting point (not shown in FIG. 3I) on the entire surface, then anneals to form the silicide layer 40 at the contact surfaces of the high melting point metal and the exposed semiconductor substrate 30. Unreacted portions of the high melting point metal are then removed by selective etching. For example, the metal may be a refractory metal, such as titanium, tantalum, molybdenum, tungsten, cobalt, nickel, etc.

Figure 3J:
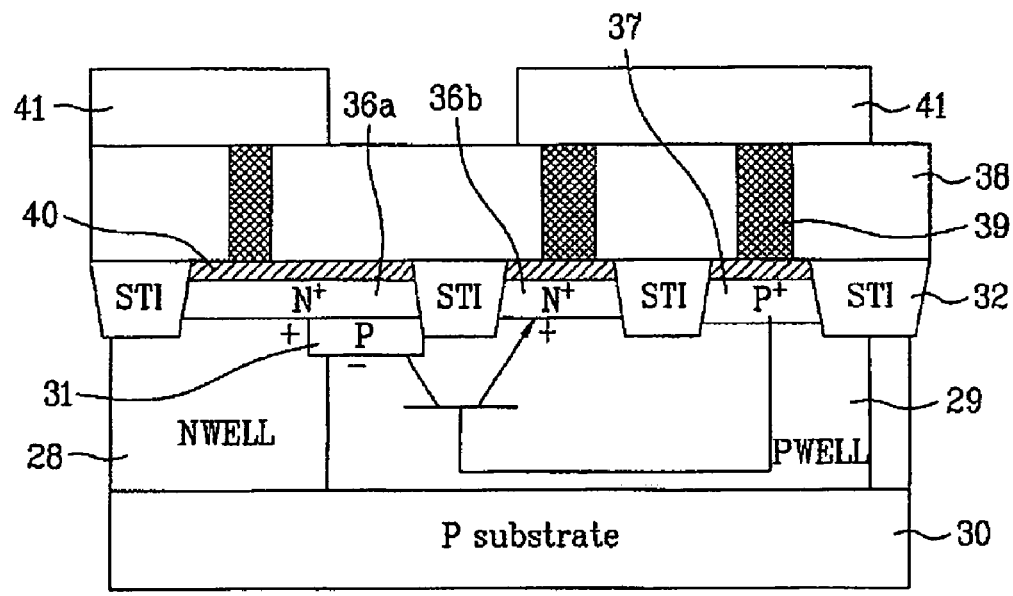

Referring to FIG. 3J, an interlayer insulating layer 38 is formed on the entire surface of the semiconductor substrate with the silicide layer 40, and contact holes are formed in the interlayer insulating layer 38 to expose portions of the silicide layer 40 on the first and second high-concentration, N-type impurity regions 36a and 36b and the high-concentration, P-type impurity region 37. Also, a plug 39 is formed in each of the contact holes, and metal lines 41 are formed to connect the plugs to other structures.

The above-described ESD protecting circuit and the manufacturing method thereof according to the present invention has the following benefits.

First, the ESD protecting circuit may be configured as a field transistor without a gate electrode, and the high breakdown voltage characteristics of a field transistor may be changed by implanting impurity ions at a well interface in the ESD protecting circuit, so that an ESD protecting circuit having a low breakdown voltage and low leakage current can be provided. Also, because the leakage current is reduced, an ESD protecting circuit can be provided for an analog I/O device that is sensitive to current fluxes.

Additionally, an N-type well is formed at a region where a drain (or emitter) contact of a field transistor is formed, to protect a junction thereof.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An ESD (electro-static discharge) protecting circuit comprising:
a device isolation layer in a field region of a semiconductor substrate having a first conductivity type;
first and second high-concentration impurity regions in the semiconductor substrate, isolated from each other by the device isolation layer and having a second conductivity type, wherein the first high-concentration impurity region contacts a first sidewall surface of the device isolation layer and the second high-concentration impurity region contacts a second sidewall surface of the device isolation layer opposite to said first sidewall surface;
a third high-concentration impurity region in the semiconductor substrate, isolated from the second high-concentration impurity region by the device isolation layer, and having the first conductivity type;
a first well in a first portion of the semiconductor substrate in contact with and below the second and third high-concentration impurity regions and below a first portion of the first high-concentration impurity region, and having the first conductivity type
a second well in a second portion of the semiconductor substrate in contact with and below a second portion of the first high-concentration impurity region on one side of the first well, and having the second conductivity type; and
a fourth impurity region below the first high-concentration impurity region at a boundary between the first and second wells, the fourth impurity region separating the first high-concentration impurity region from the first well, and having the first conductivity type.

2. The ESD protecting circuit according to claim 1, further comprising:
first, second and third silicide layers respectively on surfaces of the first, second and third high-concentration impurity regions;
an insulating layer on the semiconductor substrate;
first, second and third plugs in the insulating layer respectively in contact with the first, second and third silicide layers; and
a plurality of metal lines connected to the first, second and third plugs.

3. The ESD protecting circuit according to claim 1, wherein the first impurity region has an impurity concentration of $1\times10^{17}$ to $1\times10^{19}$ atoms/cm$^3$.

4. The ESD protecting circuit according to claim 1, wherein the semiconductor substrate comprises a P-type substrate.

5. The ESD protecting circuit according to claim 1, wherein the first conductivity type is a P-type.

6. The ESD protecting circuit according to claim 1, wherein the second conductivity type is an N-type.

7. The ESD protecting circuit according to claim 1, wherein the first well is a P-type well.

8. The ESD protecting circuit according to claim 1, wherein the second well is an N-type well.

9. The ESD protecting circuit according to claim 1, wherein the fourth impurity region is configured to reduce a breakdown voltage of the ESD protecting circuit.

10. The ESD protecting circuit according to claim 2, wherein the insulating layer is on the first, second and third silicide layers.

11. The ESD protecting circuit according to claim 1, wherein the fourth impurity region is above a portion of the first well and extends at least from the second well to the device isolation layer between the first and second high-concentration impurity regions.

12. The ESD protecting circuit according to claim 11, wherein the fourth impurity region is also above a portion of the second well.

13. The ESD protecting circuit according to claim 12, wherein the fourth impurity region has a width smaller than a width of the first high-concentration impurity region.

14. The ESD protecting circuit according to claim 1, wherein the fourth impurity region has a width smaller than a width of the first high-concentration impurity region.

15. The ESD protecting circuit according to claim 1, comprising a bipolar transistor.

16. The ESD protecting circuit according to claim 15, wherein the third high-concentration impurity region is a base of the bipolar transistor.

17. The ESD protecting circuit according to claim 16, wherein the first high-concentration impurity region is a collector of the bipolar transistor.

18. The ESD protecting circuit according to claim 17, wherein the second high-concentration impurity region is an emitter of the bipolar transistor.

19. The ESD protecting circuit according to claim 15, wherein the fourth impurity region controls breakdown voltage of the bipolar transistor.

20. The ESD protecting circuit according to claim 17, wherein the fourth impurity region controls breakdown voltage of the bipolar transistor.

* * * * *